US009575133B2

(12) United States Patent
Okada et al.

(10) Patent No.: US 9,575,133 B2
(45) Date of Patent: Feb. 21, 2017

(54) VOLTAGE DETECTION DEVICE

(71) Applicant: Rohm Co., Ltd., Kyoto (JP)

(72) Inventors: Tomokazu Okada, Kyoto (JP); Yang Yu, Kyoto (JP); Yanxin Yan, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 302 days.

(21) Appl. No.: 14/472,841

(22) Filed: Aug. 29, 2014

(65) Prior Publication Data

US 2015/0069974 A1 Mar. 12, 2015

(30) Foreign Application Priority Data

Sep. 10, 2013 (JP) .................. 2013-187591

(51) Int. Cl.
| | |
|---|---|
| G01N 27/416 | (2006.01) |
| G01R 31/36 | (2006.01) |
| G01R 19/00 | (2006.01) |
| H02J 7/00 | (2006.01) |
| H02J 13/00 | (2006.01) |
| B60L 11/18 | (2006.01) |
| H01M 10/48 | (2006.01) |
| H01M 10/42 | (2006.01) |

(52) U.S. Cl.
CPC ........ *G01R 31/3658* (2013.01); *B60L 11/1864* (2013.01); *G01R 31/3648* (2013.01); *H01M 10/48* (2013.01); *H02J 7/0021* (2013.01); *H02J 13/0062* (2013.01); *B60L 2240/547* (2013.01); *G01R 31/362* (2013.01); *H01M 2010/4271* (2013.01); *Y02T 10/7005* (2013.01); *Y02T 10/7055* (2013.01); *Y02T 10/7061* (2013.01); *Y02T 90/16* (2013.01); *Y02T 90/168* (2013.01); *Y04S 30/12* (2013.01)

(58) Field of Classification Search
CPC .................................................. G01R 31/3658
USPC ....... 320/116–124; 702/57, 63, 64; 324/426, 324/433, 434
See application file for complete search history.

(56) References Cited

U.S. PATENT DOCUMENTS

| | | | | |
|---|---|---|---|---|
| 6,762,588 | B2 * | 7/2004 | Miyazaki ............. | H02J 7/0026 320/116 |
| 8,022,669 | B2 * | 9/2011 | Li ......................... | H02J 7/0021 320/122 |
| 8,907,625 | B2 * | 12/2014 | Flippin ................. | H02J 7/0021 320/116 |
| 9,216,658 | B2 * | 12/2015 | Sekizaki ............. | B60L 11/1855 |
| 2009/0164154 | A1 | 6/2009 | Ishikawa et al. | |
| 2014/0035532 | A1 * | 2/2014 | Brandl ................. | H02J 7/0016 320/128 |

FOREIGN PATENT DOCUMENTS

JP 2009-156633 7/2009

* cited by examiner

*Primary Examiner* — Richard V Muralidar
(74) *Attorney, Agent, or Firm* — Fish & Richardson P.C.

(57) ABSTRACT

A controller, a first voltage detector, a second voltage detector, . . . and an nth voltage detector are connected together in series in this order via a common communication line. In ID setting operation, the controller transfers a unique ID of the first voltage detector to the first voltage detector via the communication line, and transfers a unique ID of the (i+1)th voltage detector to the (i+1)th voltage detector via the first to ith voltage detectors and the communication line (where in is a natural number equal to or less than (n−1)).

7 Claims, 10 Drawing Sheets

VOLTAGE DETECTION DEVICE

This nonprovisional application claims priority under 35 U.S.C. §119(a) on Patent Application No. 2013-187591 filed in Japan on Sep. 10, 2013, the entire contents of which are hereby incorporated by reference.

BACKGROUND OF THE INVENTION

1. Field of the Invention

The present invention relates to voltage detection devices.

2. Description of Related Art

In hybrid electric vehicles and the like, to obtain a high voltage for driving, a battery pack is used in which a plurality of unit batteries composed of secondary battery cells are connected in series. To achieve proper charge/discharge control through monitoring of the state of the battery pack, it is necessary to correctly recognize the voltage states of the individual unit batteries. However, since a large number of unit batteries are connected in series to obtain a high voltage, the battery pack is often managed in a form divided into a plurality of blocks, with voltage detection ICs provided on a block-by-block basis. Each voltage detection IC detects the terminal voltages of the unit batteries in the corresponding block, and transmits the results of the detection to a main IC (MPU) which manages the entire battery pack. The plurality of voltage detection ICs are, with a view to reducing wiring and terminals needed, connected via a common communication line to the main IC (that is, they are connected to the main IC in a daisy-chain configuration).

To achieve exchange of signals between the main IC and the plurality of voltage detection ICs via a common communication line, unique address numbers (unique IDs) need to be assigned to the voltage detection ICs respectively.

According to one known method (hereinafter referred to as the first conventional method), an address setting terminal is added, as an external terminal, to a voltage detection IC, and by feeding a digital signal to the address setting terminal, an address number is set. For example, in a case where eight voltage detection ICs are connected to a main IC, three bits' worth of address setting terminals (that is, three address setting terminals) are added to each voltage detection IC. For another example, in a case where 16 voltage detection ICs are connected to a main IC, four bits' worth of address setting terminals (that is, four address setting terminals) are added to each voltage detection IC.

Also proposed is a second conventional method as follows (see, for example, JP-A-2009-156633). First, a main IC transmits the address number "0" to a voltage detection IC directly coupled to the main IC. Each voltage detection IC, on receiving an address number via a communication line on the main IC side, takes as its own address number an address number obtained by incrementing the received address number by one, and delivers the address number obtained by incrementing the received address number by one to a communication line on the side away from the main IC. In this way, for example, in a case where a first to a fifth voltage detection IC are connected in this order starting from the main IC, the first to fifth voltage detection ICs are assigned the address numbers "1" to "5" respectively.

With the first conventional method, terminals dedicated to address setting need to be provided on each voltage detection IC. As the number of voltage detection ICs connected increases, the number of dedicated terminals needed increases. It is however undesirable to add such dedicated terminals, because doing so restricts the package of voltage detection ICs, increases the size of voltage detection ICs, or invites other inconveniences.

With the second conventional method, each voltage detection IC needs to set an address on a voltage detection IC in the next stage (a voltage detection IC on the side away from the main IC). That is, each voltage detection IC needs to be additionally furnished with a function for address setting. Inconveniently, this complicates the entire system.

SUMMARY OF THE INVENTION

An object of the present invention is to provide a voltage detection device that allows the setting of unique IDs by a simple method without inviting an increase in the number of terminals.

According to a first aspect of the present invention, a voltage detection device includes: first to nth voltage detectors (where n is an integer equal to or greater than 2) which are connected to a battery pack composed of a plurality of unit batteries connected together, the battery pack being divided into n blocks, the first to nth voltage detectors detecting the terminal voltages of the individual unit batteries on a block-by-block basis; a controller which receives voltage detection result signals indicating the results of detection of the terminal voltages from the first to nth voltage detectors respectively after ID setting operation whereby the first to nth voltage detectors are assigned mutually different unique IDs; and a communication line which connects together the controller, the first voltage detector, the second voltage detector, . . . and the nth voltage detector in series in this order for transfer of signals for the ID setting operation and the voltage detection result signals. In the ID setting operation, the controller transfers the unique ID of the first voltage detector to the first voltage detector via the communication line, and transfers the unique ID of the (i+1)th voltage detector to the (i+1)th voltage detector via the first to ith voltage detectors and the communication line (where i is a natural number equal to or less than (n−1)).

According to a second aspect of the present invention, a voltage detection device includes: first to nth voltage detectors (where n is an integer equal to or greater than 2) which are connected to a battery pack composed of a plurality of unit batteries connected together, the battery pack being divided into n blocks, the first to nth voltage detectors detecting the terminal voltages of the individual unit batteries on a block-by-block basis; a controller which receives voltage detection result signals indicating the results of detection of the terminal voltages from the first to nth voltage detectors respectively after ID setting operation whereby the first to nth voltage detectors are assigned mutually different unique IDs; and a communication line which connects together the controller, the first voltage detector, the second voltage detector, . . . and the nth voltage detector in series in this order. The communication line includes a synchronizing clock line for transfer of a synchronizing clock signal for achieving synchronization between the controller and the voltage detectors. In the ID setting operation, the controller outputs a synchronizing clock signal with a predetermined clock count to the synchronizing clock line between the controller and the first voltage detector, the ith voltage detector outputs a synchronizing clock signal based on a received synchronizing clock signal to the synchronizing clock line between the ith voltage detector and (i+1)th voltage detector such that the clock count in the synchronizing clock signal received by each voltage detector differs among the first to n-th voltage detectors (where i is a natural number equal to or less than (n−1)), and each voltage detector takes as its own unique ID a unique ID according to the clock count in the received synchronizing clock signal.

DETAILED DESCRIPTION OF PREFERRED EMBODIMENTS

Hereinafter, examples of embodiment of the present invention will be described specifically with reference to the accompanying drawings. Among different drawings referred to, the same parts are identified by the same reference signs, and in principle no overlapping description of the same parts will be repeated. In the present specification, for simplicity's sake, symbols and signs referring to information, signals, physical quantities, states, members, etc. are occasionally used with the names of the corresponding information, signals, physical quantities, states, members, etc. omitted or abbreviated.

Figure 1:
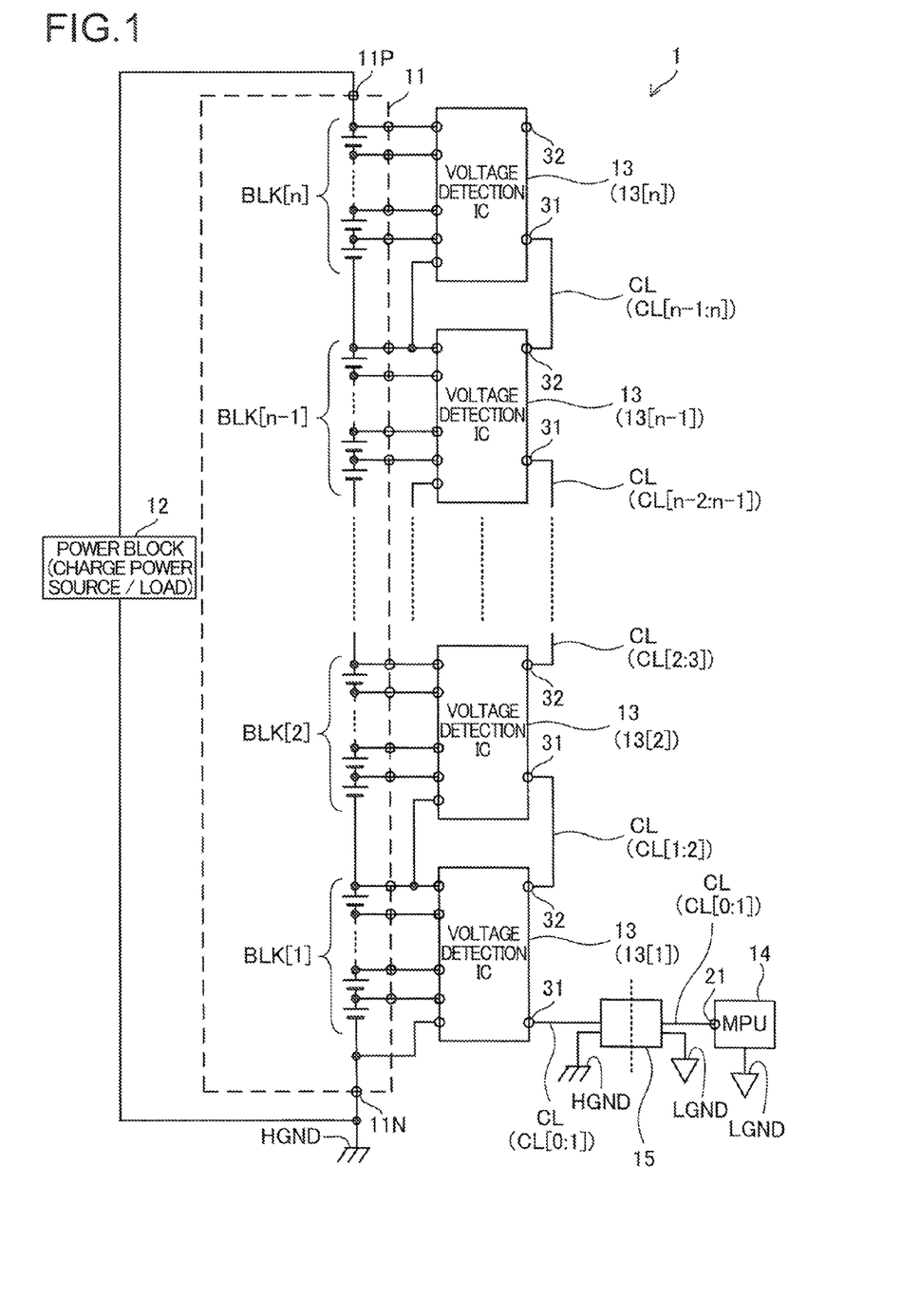
FIG. 1 is an outline overall block diagram of a power system embodying the present invention.

FIG. 1 is an outline overall block diagram of a power system (electric power system) 1 embodying the present invention. The power system 1 includes a battery pack 11, a power block 12, a plurality of voltage detection ICs 13, an MPU 14, an isolator 15, and a communication line CL.

The battery pack 11 is composed of a plurality of unit batteries. The unit batteries are secondary batteries such as lithium-ion batteries or nickel-hydride batteries. Each unit battery can be composed of a single secondary battery cell, or of a plurality of secondary battery cells. In the battery pack 11, the plurality of unit batteries are connected in series, and a serially connected circuit of the plurality of unit batteries is managed in a form divided into n blocks, where n is an integer equal to or greater than 2.

Each block of the battery pack 11 has a serially connected circuit of a plurality of unit batteries. The n blocks of the battery pack 11 are referred to by the reference signs BLK[1] to BLK[n] respectively. For a given integer i, the unit batteries in the block BLK[i+1] have higher potentials than the unit batteries in the block BLK[i]. The negative electrode of the unit battery having the lowest potential in the block BLK[i+1] and the positive electrode of the unit battery having the highest potential in the block BLK[i] are connected together, except that the negative electrode of the unit battery having the lowest potential in the block BLK[1] is connected to a negative output terminal 11N of the battery pack 11, and that the positive electrode of the unit battery having the highest potential in the block BLK[n] is connected to a positive output terminal 11P of the battery pack 11. The potential at the negative output terminal 11N is referred to by the reference sign HGND. During charging of the battery pack 11, charge electric power is supplied to the battery pack 11 via the pair of output terminals 11P and 11N so that each unit battery is charged. During discharging of the battery pack 11, discharge electric power from each unit battery is extracted via the pair of output terminals 11P and 11N.

The power block 12 is connected to the pair of output terminals 11P and 11N, and can supply charge electric power to the battery pack 11 or be supplied with discharge electric power from the battery pack 11. The power block 12 includes a charge power source which outputs DC (direct-current) or AC (alternating-current) electric power and an arbitrary load that operates by being supplied with electric power, and can further include a power conversion circuit which converts the output electric power of the charge power source into charge electric power for the battery pack 11, and which converts the discharge electric power of the battery pack 11 into supply electric power for the load.

The voltage detection ICs 13 are each composed of integrated circuits including a ROM (read-only memory), a RAM (random-access memory), and an operation processing circuit. The plurality of voltage detection ICs 13 detect, on a block-by-block basis, the terminal voltages (voltages between the positive and negative electrodes) of the individual unit batteries. Of the voltage detection ICs 13 provided in the power system 1, the voltage detection IC 13 corresponding to the block BLK[i] is particularly referred to by the symbol 13[i] (wherever association with a particular block does not matter, the reference sign "13" is used). The voltage detection ICs 13[1] to 13[n] are similar in configuration and operation, and accordingly any description of a voltage detection IC 13[i] applies equally to all voltage detection ICs 13[1] to 13[n]. In the following description, a voltage detection IC 13 or voltage detection IC 13[i] is also referred to simply as an IC 13 or IC 13[i]. The IC 13[i] is connected to the negative and positive electrodes of every unit battery in the block BLK[i], and detects the terminal voltage (voltage between the positive and negative electrodes) of every unit battery in the block BLK[i] by use of a differential amplifier, an AD converter, etc. The operation performed to achieve this detection is referred to as voltage detection operation, and a digital signal that indicates a result of voltage detection operation is referred to as a voltage detection result signal.

The voltage detection IC 13[i] can perform voltage detection operation in response to a detection instruction command from the MPU 14, or can perform voltage detection operation periodically, without relying on a detection instruction command from the MPU 14, and hold the results sequentially on a constantly updating basis. Within each block of the battery pack 11, the negative electrode potential of the unit battery having the lowest potential and the positive electrode potential of the unit battery having the highest potential are referred to as the block lowest potential and the block highest potential respectively. The block lowest potential in the block BLK[i] corresponds to the ground level of the voltage detection IC 13[i]. The voltage detection IC 13[i] includes, for generation of its own driving voltage, a power supply circuit (not shown) which generates it based on the voltage between the block lowest potential and the block highest potential in the block BLK[i], and operates by use of the driving voltage.

The MPU (micro-processing unit) 14 is composed of integrated circuits including a ROM (read-only memory), a RAM (random-access memory), and an operation processing circuit. The MPU 14 issues various commands to each voltage detection IC 13, and receives signals from each voltage detection IC 13 in response to the commands. Here, the received signals include a voltage detection result signal, so that based on a voltage detection result signal from each IC 13, the MPU 14 can, through its control of the power block 12, control the charging and discharging of the battery pack 11. The MPU 14 operates with reference to a ground line potential LGND which is isolated from the battery pack 11 and the voltage detection ICs 13.

The MPU 14 and the n ICs 13 are connected together in a daisy-chain configuration, starting from the MPU 14, via the communication line CL. More specifically, the MPU 14 and the ICs 13[1] to 13[n] are connected together in series in the following order via the communication line CL: MPU 14, IC 13[1], 13[2], . . . 13[n-1], and 13[n].

Of the communication line CL, the part between the MPU 14 and the IC 13[1] is particularly referred to by the symbol CL[0:1] and the part between the ICs 13[i] and 13[i+1] is particularly referred to by the symbol CL[i:i+1]. In the communication line CL[0:1] between the MPU 14 and the IC 13[1], the isolator 15 is serially inserted. Composed of a photocoupler or magnetic coupler, the isolator 15 electrically isolates the MPU 14 and the IC 13[1] from each other while coupling them together via the communication line CL. Of the communication line CL[0:1], the part between the MPU 14 and the isolator 15 transfers a voltage signal with reference to the potential LGND, and the part between the IC 13[1] and the isolator 15 transfers a voltage signal with reference to the potential HGND.

The MPU 14 can communicate with each voltage detection IC 13 via the communication line CL. In the following description, it is assumed that, among the MPU 14 and the ICs 13[1] to 13[n], the MPU 14 is the highest in hierarchy and the IC 13[i+1] is lower than IC 13[i] in hierarchy. The MPU 14 has a communication port 21 which is connected to the communication line CL[0:1]. The IC 13[i] has a high-side port 31 which is connected to the communication line CL[i-1:i] and a low-side port 32 connected to the communication line CL[i:i+1], except that no communication line CL is connected to the low-side port 32 of the IC 13[n].

Due to a difference in ground level between the ICs 13[i] and 13[i+1], the reference potential for a voltage signal at the port 32 of the IC 13[i] differs from the reference potential for a voltage signal at the port 31 of the IC 13[i+1]. To cancel this difference, a level shift circuit (not shown) can be serially inserted in the communication line CL[i:i+1] to enable communication between the ICs 13[i] and 13[i+1] via the port 32 of the former and the port 31 of the latter. Instead, an isolator (not shown) for coupling together the port 32 of the IC 13[i] and the port 31 of the IC 13[i+1] while electrically isolating them can be serially inserted in the communication line CL[i:i+1].

So long as communication is possible among the MPU 14 and the ICs 13[1] to 13[n] which are connected together in a daisy-chain configuration, the communication line CL and the ports 21, 31, and 32 can be configured in any manner, and communication can be conducted by any method. For example, full-duplex or half-duplex communication can be adopted, and synchronous or asynchronous communication can be adopted.

Figure 2:
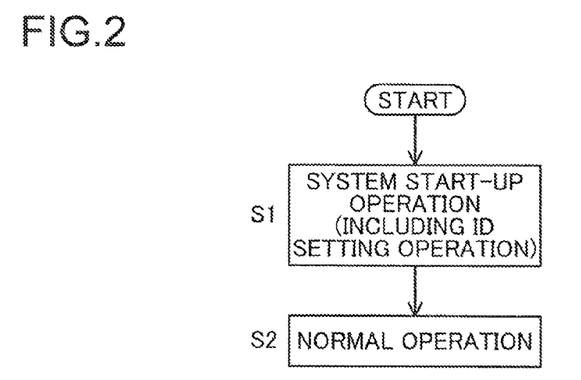
FIG. 2 is an outline operation flow chart of the power system shown in FIG. 1, with focus placed on communication.

FIG. 2 is an outline operation flow chart of the power system 1, with focus placed on the communication among the MPU 14 and the ICs 13[1] to 13[n]. When the MPU 14 starts up, first, at step S1, under the control of the MPU 14, system start-up operation including ID setting operation is executed. After completion of the system start-up operation, at step S2, normal operation is executed.

The ID setting operation is operation whereby the ICs 13[1] to 13[n] are assigned mutually different unique IDs. The unique IDs are pieces of information for identifying each IC 13 from the other ICs 13. To enable communication via the common communication line CL among the MPU 14 and the ICs 13[1] to 13[n], the ID setting operation is vital. Here, it is assumed that the unique IDs are in the form of address numbers, and that, through the ID setting operation, the ICs 13[1], 13[2], . . . and 13[n] are assigned the address numbers "1," "2," . . . and "n," respectively, as unique IDs.

After the ID setting operation, the MPU 14 can, while distinguishing the ICs 13[1] to 13[n] on the basis of the assigned unique IDs, communicate with the individual ICs 13 via the communication line CL. Thus, for example, after the ID setting operation, the MPU 14 can receive voltage detection result signals from the ICs 13 individually via the communication line CL.

Now, with reference to FIG. 3, on the assumption that n=4, an example of a flow of communication in the normal operation will be described. In the normal operation, first, the MPU 14 issues, for the IC 13 having the address number "1" (that is 13[1]), a command 310 requesting transmission of a voltage detection result signal, and outputs the command 310 from the port 21 to the communication line CL[0:1]. The command 310 can be a command requesting execution of voltage detection operation, or a command requesting execution of voltage detection operation and transmission of a voltage detection result signal (the same applies equally to the later-described commands 320, 330, and 340).

In the normal operation, any command delivered from the MPU 14 to the communication line CL[0:1] is transferred to the IC 13[1], and is further, via communication lines CL[1:2], CL[2:3], and CL[3:4] successively, transferred also to the ICs 13[2], 13[3], and 13[4]. Thus, the command 310 is transferred to the ICs 13[1] to 13[4]. However, since the command 310 is a command for the IC 13 having the address number "1," that is, the IC 13[1], among the ICs 13[1] to 13[4], only the IC 13[1] responds to the command 310, and thus the IC 13[1] transmits a response signal 315 including a voltage detection result signal from the port 31 via the communication line CL[0:1] toward the MPU 14.

On receiving the response signal 315, the MPU 14 then issues, for the IC 13 having the address number "2" (that is 13[2]), a command 320 requesting transmission of a voltage detection result signal, and outputs the command 320 from the port 21 to the communication line CL[0:1]. Like the command 310, the command 320 is transferred to the ICs 13[1] to 13[4]. However, since the command 320 is a command for the IC 13 having the address number "2," that is, the IC 13[2], among the ICs 13[1] to 13[4], only the IC 13[2] responds to the command 320, and thus the IC 13[2] transmits a response signal 325 including a voltage detection result signal from the port 31 via the communication line CL[1:2] toward the MPU 14. When an IC 13[i] receives at its port 32 a signal from the IC 13[i+1], the IC 13[i] outputs from its port 31 the received signal. Accordingly, the response signal 325 transmitted from the IC 13[2] is transferred via the IC 13[1] and the communication line CL[0:1] to the MPU 14.

On receiving the response signal 325, the MPU 14 then issues, for the IC 13 having the address number "3" (that is 13[3]), a command 330 requesting transmission of a voltage detection result signal, and outputs the command 330 from the port 21 to the communication line CL[0:1]. Like the command 310, the command 330 is transferred to the ICs 13[1] to 13[4]. However, since the command 330 is a command for the IC 13 having the address number "3," that is, the IC 13[3], among the ICs 13[1] to 13[4], only the IC 13[3] responds to the command 330, and thus the IC 13[3] transmits a response signal 335 including a voltage detection result signal from the port 31 via the communication line CL[2:3] toward the MPU 14. The response signal 335 transmitted from the IC 13[3] is transferred, via the IC 13[2], the communication line CL[1:2], the IC 13[1], and the communication line CL[0:1], to the MPU 14.

On receiving the response signal 335, the MPU 14 then issues, for the IC 13 having the address number "4" (that is 13[4]), a command 340 requesting transmission of the voltage detection result signal, and outputs the command 340 from the port 21 to the communication line CL[0:1]. Then, in a similar manner as described above, the IC 13[4] responds to the command 340, and thus the IC 13[4] transmits a response signal 345 including a voltage detection result signal from the port 31 via the communication line CL[3:4] toward the MPU 14. The response signal 345 is transferred, via the IC 13[3], the communication line CL[2:3], the IC 13[2], the communication line CL[1:2], the IC 13[1], and the communication line CL[0:1], to the MPU 14.

Through periodic transmission and reception of commands and response signals as described above, the MPU 14 can continuously monitor the terminal voltages of all unit batteries in the battery pack 11. The ICs 13 can be so configured that, when an IC 13[i] receives a command addressed to it, the command is not transmitted toward the IC 13[i+1]. For example, a configuration is possible where, when the IC 13[1] receives a command 310, the IC 13[1] does not transmit the command 310 from its port 32. A response signal (for example, 315) can include the address number of the voltage detection IC 13 (for example, 13[1]) which has transmitted the response signal. This permits the MPU 14 to correctly identify the sender of a response signal.

The power system 1 achieves ID setting operation through distinctive operation. Specific examples of ID setting operation, or examples of configuration and operation associated with communication, will now be described by way of several examples of implementation. Unless inconsistent, any two or more of the examples presented below can be combined together.

First Example

A first example of the power system 1 will be described. In the first example, during the ID setting operation, the MPU 14 transfers the address number of the IC 13[1] directly to the IC 13[1] via the communication line CL[0:1], and transfers the address number of the IC 13[i+1] directly to the IC 13[i+1] via the ICs 13[1] to 13[i] and the communication lines CL[0:1] to CL[i:i+1] (here, i is a natural number equal to or less than (n−1)). Each IC 13 can assign itself the address number transferred to it.

Figure 4:
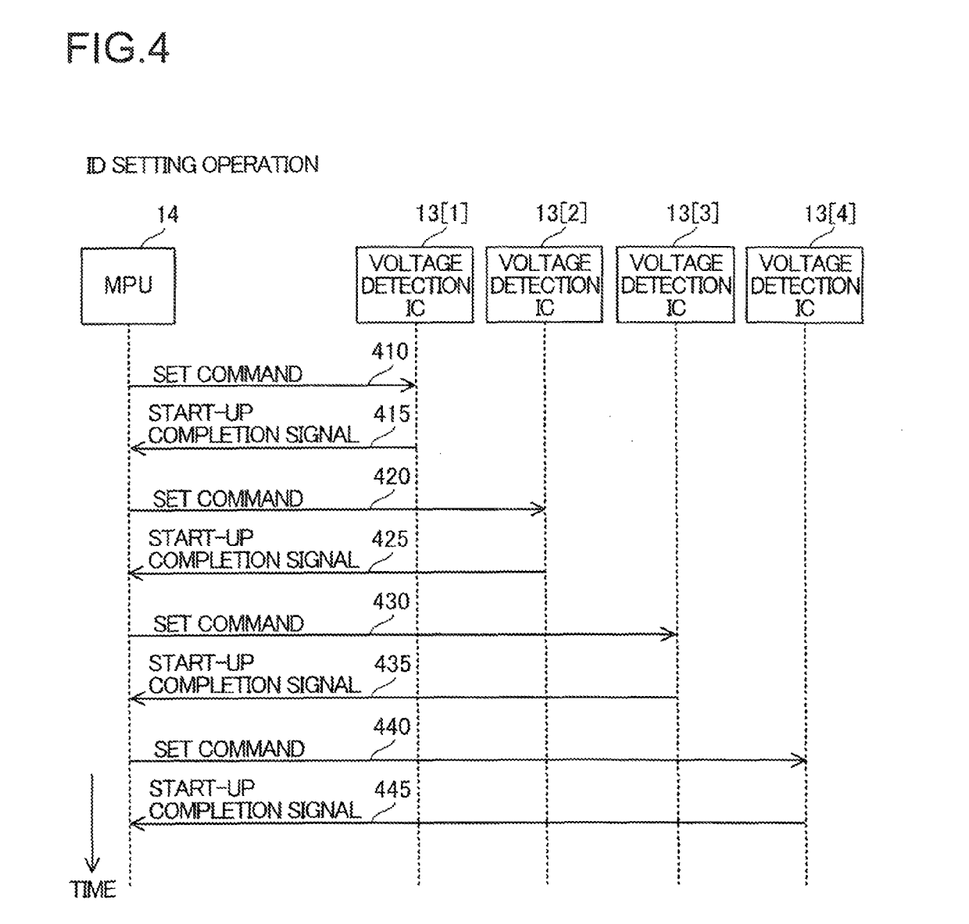
FIG. 4 is a concept diagram showing a flow of ID setting operation in a first example of the present invention.
Figure 5:
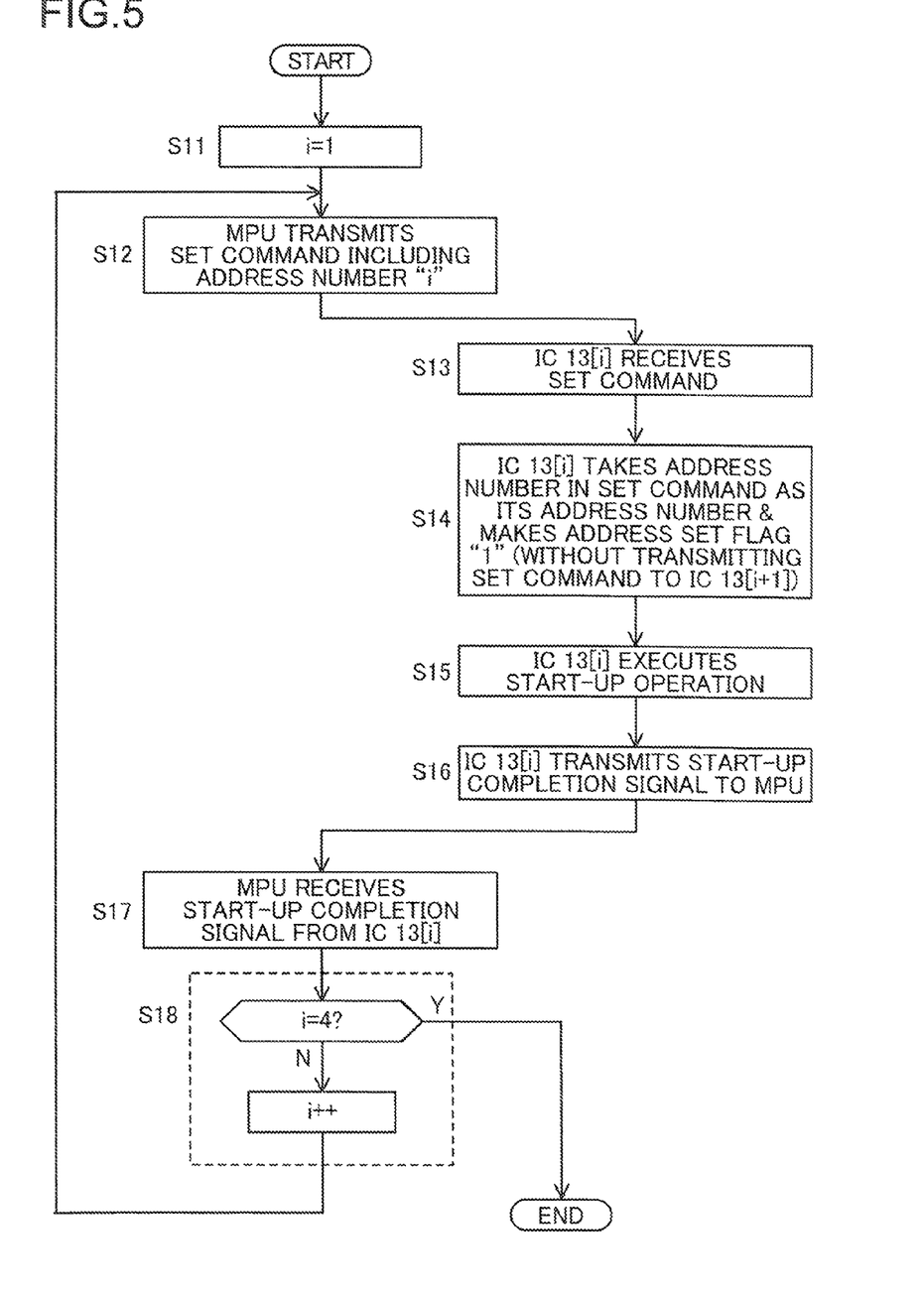
FIG. 5 is an operation flow chart of ID setting operation in the first example of the present invention.

Now, with reference to FIGS. 4 and 5, on the assumption that n=4, the ID setting operation according to the first example will be described. FIG. 4 is a concept diagram showing the flow of the ID setting operation. FIG. 5 is an operation flow chart of the ID setting operation. In FIG. 5, the steps shown in the left side, namely steps S11, S12, S17, and S18 are executed by the MPU 14, and the steps shown in the right side, namely steps S13 through S16 are executed by the voltage detection ICs 13. At step S11, the value "1" is substituted in the variable i, so that with i=1, the operations at steps S12 through S18 are executed for the first time; then, with i=2, the operations at steps S12 through S18 are executed for the second time; then, with i=3, the operations at steps S12 through S18 are executed for the third time; and lastly, with i=4, the operations at steps S12 through S18 are executed for the fourth time.

Before execution of the ID setting operation, the address numbers of the ICs 13[1] to 13[4] all have an initial value (for example, "0"), and the address set flag held in each IC 13 has a value of "0." With respect to an IC 13[i], if the address set flag is "0," it means that the address number is not set yet, and if the address set flag is "1," it means that the address number is already set.

In the ID setting operation, first, the MPU 14 issues a set command 410 which is a command including the address number "1" and which demands that the address number be set at "1," and outputs the set command 410 from the port 21 to the communication line CL[0:1] (S12 for the first time).

The IC 13[1] receives the set command 410 via the communication line CL[0:1] (S13 for the first time). If an IC 13[i], with "0" in the address set flag held in it, receives a set command, the IC 13[i] takes the address number in the received set command as its own address number, and makes the address set flag held in it "1." Accordingly, on receiving the set command 410, the IC 13[1] takes the address number "1" in the set command 410 as its own address number, and makes the address set flag held in it "1" (S14 for the first time). If an IC 13[i], with "0" in the address set flag held in it, receives a set command, the IC 13[i] does not output the received set command from its port 32 (that is, it does not transmit the received set command to the IC 13[i+1]). Accordingly, the IC 13[1] does not output the set command 410 from the port 32, and thus the set command 410 is not transferred to the ICs 13[2] to 13[4].

A set command also functions as a start-up command for instructing an IC 13 to start up. It can also be understood that, along with a set command, a start-up command also is transmitted from the MPU 14. Here, however, it is assumed that a set command itself also functions as a start-up command. Accordingly, on receiving the set command 410, the IC 13[1] executes predetermined start-up operation (S15 for the first time), and on completion of the start-up operation, the IC 13[1] transmits a start-up completion signal 415 via the port 31 and the communication line CL to the MPU 14 (S16 for the first time). The operation executed in an IC 13[i] to set the address number and make the address set flag "1" according to a set command can be understood to be a kind of start-up operation. In a case where a level-shift circuit as mentioned above is provided in the communication line CL[i:i+1], operation for starting up the level-shift circuit to enable communication between the ICs 13[i] and 13[i+1] is also included in the start-up operation. On receiving the start-up completion signal 415 from the IC 13[1], the MPU 14 increments the variable i by one (increases the variable i to "2"), and then a return is made to step S12 (S17 and S18 for the first time).

Then, the MPU 14 issues a set command 420 which is a command including the address number "2" and which demands that the address number be set at "2," and outputs the set command 420 from the port 21 to the communication line CL[0:1] (S12 for the second time).

If an IC 13[*i*], with "1" in the address set flag held in it, receives a set command, the IC 13[*i*] ignores the demand of the received set command, and outputs the received set command from the port 32 to the communication line CL[i:i+1] to transfer it to the IC 13[*i*+1]. Thus, the set command 420 is received by the IC 13[1], but since, before its reception, the address set flag of the IC 13[1] is "1," the set command 420 is output from the port 32 of the IC 13[1] to the communication line CL[1:2]. Thus, the set command 420 is received by the IC 13[2] (S13 for the second time). At this stage, the address set flag of the IC 13[2] is "0." Accordingly, on receiving the set command 420, the IC 13[2] takes the address number "2" in the set command 420 as its own address number, and makes the address set flag held in it "1" (S14 for the second time). Here, the IC 13[2] does not output the set command 420 from the port 32, and thus the set command 420 is not transferred to the ICs 13[3] and 13[4].

On receiving the set command 420, the IC 13[2] executes predetermined start-up operation (S15 for the second time), and on completion of the start-up operation, the IC 13[2] transmits a start-up completion signal 425 via the port 31 and the communication line CL to the MPU 14 (S16 for the second time). On receiving the start-up completion signal 425 from the IC 13[2], the MPU 14 increments the variable i by one (makes the variable i "3"), and a return is made to step S12 (S17 and S18 for the second time).

Then, the MPU 14 issues a set command 430 which is a command including the address number "3" and which demands that the address number be set at "3," and outputs the set command 430 from the port 21 to the communication line CL[0:1] (S12 for the third time). At this stage, the address set flags of the ICs 13[1] and 13[2] are "1," and accordingly the set command 430 is transferred up to the IC 13[3], and is received by the IC 13[3] (S13 for the third time). On receiving the set command 430, the IC 13[3], operating in a similar manner as the IC 13[1] etc., the IC 13[3] takes the address number "3" in the set command 430 as its address number, and makes the address set flag held in it "1" (S14 for the third time). Here, the IC 13[3] does not output the set command 430 from the port 32, and thus the set command 430 is not transferred to the IC 13[4]. On receiving the set command 430, the IC 13[3] executes predetermined start-up operation (S15 for the third time), and on completion of the start-up operation, the IC 13[3] transmits a start-up completion signal 435 via the port 31 and the communication line CL to the MPU 14 (S16 for the third time). On receiving the start-up completion signal 435 from the IC 13[3], the MPU 14 increments the variable i by one (makes the variable i "4"), and a return is made to step S12 (S17 and S18 for the third time).

Then, the MPU 14 issues a set command 440 which is a command including the address number "4" and which demands that the address number be set at "4," and outputs the set command 440 from the port 21 to the communication line CL[0:1] (S12 for the fourth time). At this stage, the address set flags of the ICs 13[1] to 13[3] are "1," and accordingly the set command 440 is transferred up to the IC 13[4], and is received by the IC 13[4] (S13 for the fourth time). On receiving the set command 440, the IC 13[4], operating in a similar manner as the IC 13[1] etc., the IC 13[4] takes the address number "4" in the set command 440 as its address number, and makes the address set flag held in it "1" (S14 for the fourth time). On receiving the set command 440, the IC 13[4] executes predetermined start-up operation (S15 for the fourth time), and on completion of the start-up operation, the IC 13[4] transmits a start-up completion signal 445 via the port 31 and the communication line CL to the MPU 14 (S16 for the fourth time). On receiving the start-up completion signal 445 from the IC 13[4], since now the variable i is "4," that is, it has reached the number of ICs 13 connected to the MPU 14, the MPU 14 ends the ID setting operation (S17 and S18 for the fourth time).

In a case where the MPU 14 is not previously notified of the number of ICs 13 connected to the MPU 14, after receiving the start-up completion signal 445, the MPU 14 can output a fifth set command to the communication line CL[0:1]. In that case, since no IC 13 exists that responds to the fifth set command, no start-up completion signal in response to the fifth set command is returned to the MPU 14. If, a predetermined period after the transmission of the fifth set command, no start-up completion signal is received, the MPU 14 can, recognizing that the number of ICs 13 connected to the MPU 14 is "4," end the ID setting operation.

According to the first example, there is no need for terminals dedicated to address setting as are needed in the first conventional method. Moreover, according to the first example, the MPU 14 transfers address numbers directly to the individual ICs 13, and therefore there is no need to additionally furnish the individual voltage detection ICs with a function for address setting as in the second conventional method. This helps avoid complicating the entire system.

With the ID setting operation described above, after one set command is transmitted, until a start-up completion signal is received in response, the MPU 14 waits for transmission of the next set command. For example, after the set command 410 is transmitted, until the start-up completion signal 415 is received, the MPU 14 waits for transmission of the set command 420. This is because it is after completion of the start-up operation of the IC 13[1] that transfer of a command to the IC 13[2] becomes possible. However, considering that the time required for the start-up operation by an IC 13 is roughly known previously, the MPU 14 can, without waiting for reception of start-up completion signals, output set commands 410, 420, 430, and 440 sequentially, at predetermined time intervals, to the communication line CL[0:1]. In that case, there is no need for transmission of start-up completion signals from the ICs 13.

Second Example

A second example of the power system 1 will be described. As mentioned previously, the communication among the MPU 14 and the ICs 13[1] to 13[*n*] can be conducted by any method, and the second example deals with an example of implementation of the communication.

Figure 6:
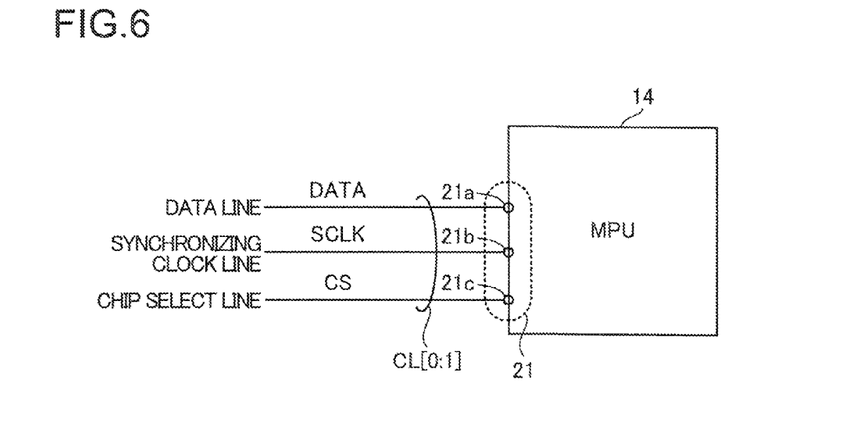
FIG. 6 is a diagram showing a structure of communication ports of an MPU.
Figure 7:
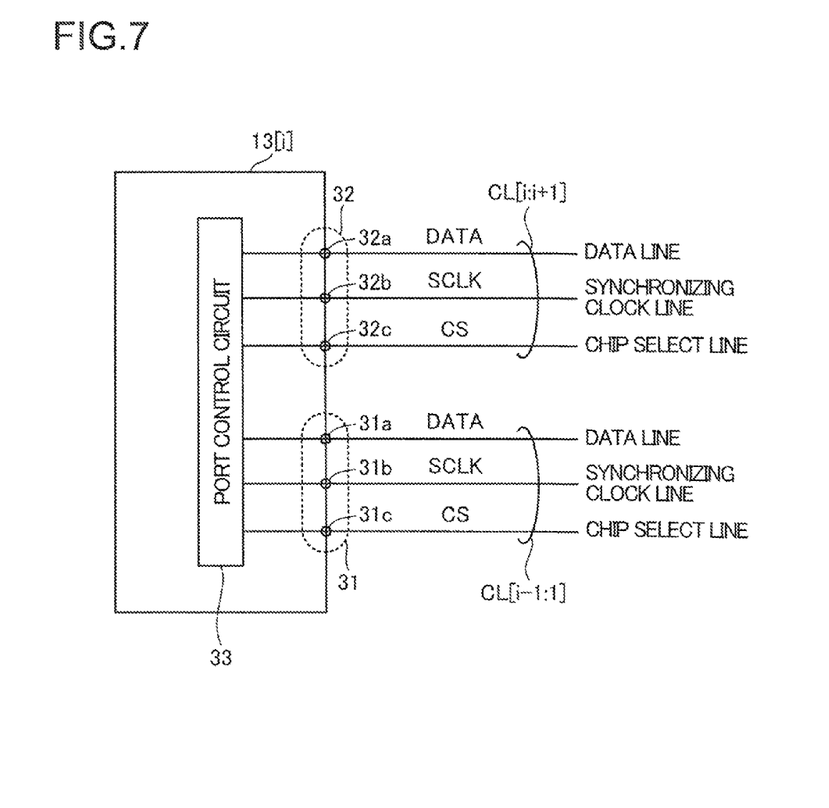
FIG. 7 is a diagram showing a structure of high- and low-side ports of a voltage detection IC.

FIGS. 6 and 7 show the structure of the communication port 21 of the MPU 14, the structure of the high- and low-side ports 31 and 32 of an IC 13[*i*], and the structure of the communication line CL in the second example. As shown in FIGS. 6 and 7, the communication lines CL[0:1] to CL[n−1:n] each include a data line across which a signal DATA is transferred, a synchronizing clock line across which a signal SCLK is transferred, and a chip select line across which a signal CS is transferred. The signal DATA is a data signal, and contains the contents of commands issued by the MPU 14, the contents of voltage detection result signals from the ICs 13, etc. The signal SCLK is a synchronizing clock signal for achieving synchronization in the communication between the ICs 13 and the MPU 14. The logical value of the signal DATA at each shift from a low level to a high level in the signal SCLK counts as one bit's worth of information. The signal CS is a chip select signal which determines whether or not the signals DATA and SCLK transferred across the data line and the synchronizing clock line are valid.

As shown in FIG. 6, the communication port 21 of the MPU 14 includes terminals 21a, 21b, and 21c. The terminals 21a, 21b, and 21c are connected respectively to the data line, synchronizing clock line, and chip select line in the communication line CL[0:1]. As shown in FIG. 7, the high-side port 31 includes terminals 31a, 31b, and 31c, and the low-side port 32 includes terminals 32a, 32b, and 32c. In the IC 13[i], the terminals 31a, 31b, and 31c are connected respectively to the data line, synchronizing clock line, and chip select line in the communication line CL[i−1:i], and the terminals 32a, 32b, and 32c are connected respectively to the data line, synchronizing clock line, and chip select line in the communication line CL[i:i+1].

In a case where the structure shown in FIGS. 6 and 7 is adopted, the MPU 14 and each of the ICs 13[1] to 13[n] conduct half-duplex serial communication via the communication line CL.

In a transmission mode, where the MPU 14 acts as a transmitter, the terminals 21a to 21c and 32a to 32c function as voltage output terminals, and the terminals 31a to 31c function as voltage input terminals. In a reception mode, where the MPU 14 acts as a receiver, the terminals 21a to 21c and the 32a to 32c function as voltage input terminals, an the terminals 31a to 31c function as voltage output terminals. In the transmission mode, in synchronism with the synchronizing clock signal SCLK output from the MPU 14, a signal DATA is transmitted from the MPU 14 to the ICs 13. In the reception mode, in synchronism with the synchronizing clock signal SCLK output from one of the ICs 13, a signal DATA is transmitted from that IC 13 to the MPU 14. A port control circuit 33 provided in the IC 13[i] controls the states of the ports 31 and 32 so as to enable communication between the MPU 14 and the ICs 13 via the communication line CL.

Instead, the signals SCLK and CS can be output from the MPU 14 all the time. Specifically, it is possible, in synchronism with the synchronizing clock signal SCLK output from the MPU 14, to transmit a signal DATA from the MPU 14 to the ICs 13 and also to transmit a signal DATA from the ICs 13 to the MPU 14. In that case, the terminals 21b, 21c, 32b, and 32c always function as voltage output terminals, and the terminals 31b and 31c always function as voltage input terminals. The data line can include separate lines, one for a signal DATA transmitted from a low side to a high side and the other for a signal DATA transmitted from a high side to a low side.

Figure 8:
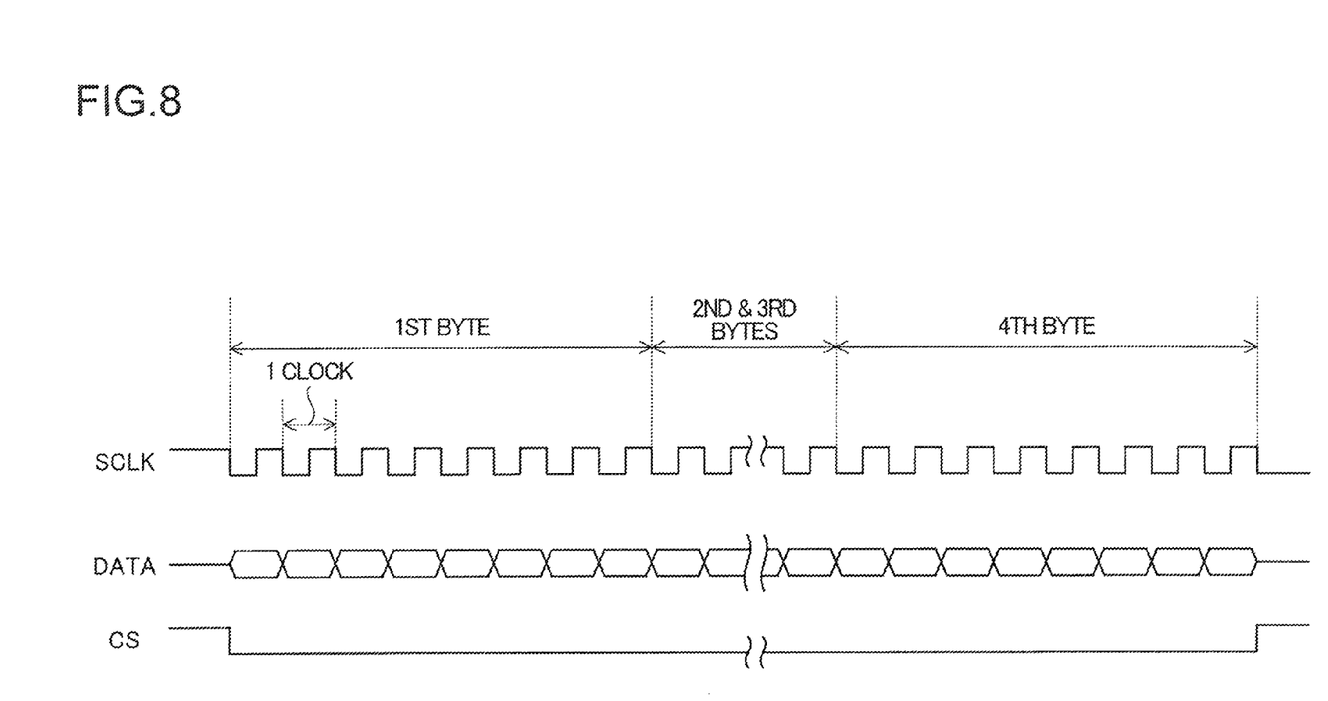
FIG. 8 is a diagram showing an example of a configuration of a command.

FIG. 8 shows an example of a configuration of a command. A command issued by and output from the MPU 14 is a four-byte signal DATA. One byte consists of eight bits. Accordingly, a one-byte signal DATA is assigned eight clocks of a signal SCLK, which is a synchronizing clock signal. The signal SCLK is a rectangular wave taking, as its signal levels, a high level or a low level at a time, and one period's worth of the rectangular wave corresponds to one clock. The first byte of the signal DATA of a command contains an address number as information. The second and third bytes of the signal DATA of the command contain the content of an instruction for an IC 13. The fourth byte of the signal DATA of the command contains information for error detection/correction.

Figure 3:
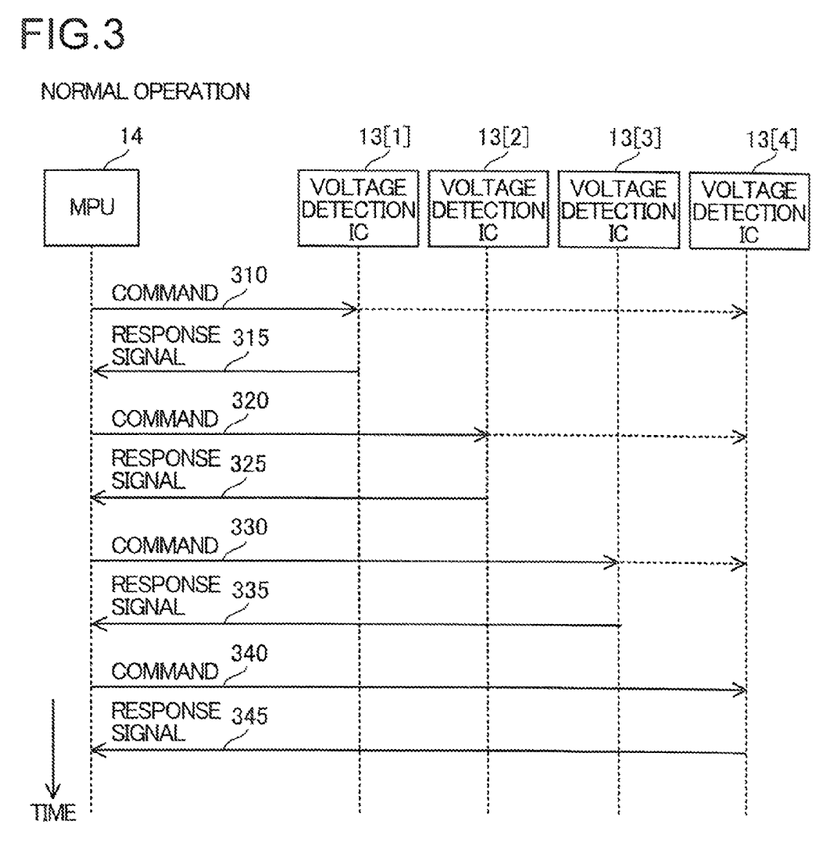
FIG. 3 is a diagram showing communication between an MPU and ICs in normal operation.

Accordingly, suppose the command in FIG. 8 is the command 330 in FIG. 3, then the command in FIG. 8 is a sequence consisting of a one-byte signal DATA specifying the address number "3," a two-byte signal DATA demanding transmission of a voltage detection result signal, and a signal DATA for error detection/correction. The MPU 14 delivers the command, along with a four-byte signal SCLK, to the communication line CL[0:1]. While transmitting the command, the MPU 14 keeps the signal CS at low level. At low level, the signal CS indicates that the signals DATA and SCLK transferred across the data line and the synchronizing clock line are valid. At high level, the signal CS indicates that the signals DATA and SCLK transferred across the data line and the synchronizing clock line are invalid. On receiving the command 330, the IC 13[3] can transmit a response signal 335 (see FIG. 3) including a signal DATA indicating its own voltage detection result signal to the MPU 14 in synchronism with the synchronizing clock signal SCLK.

Third Example

Figure 9:
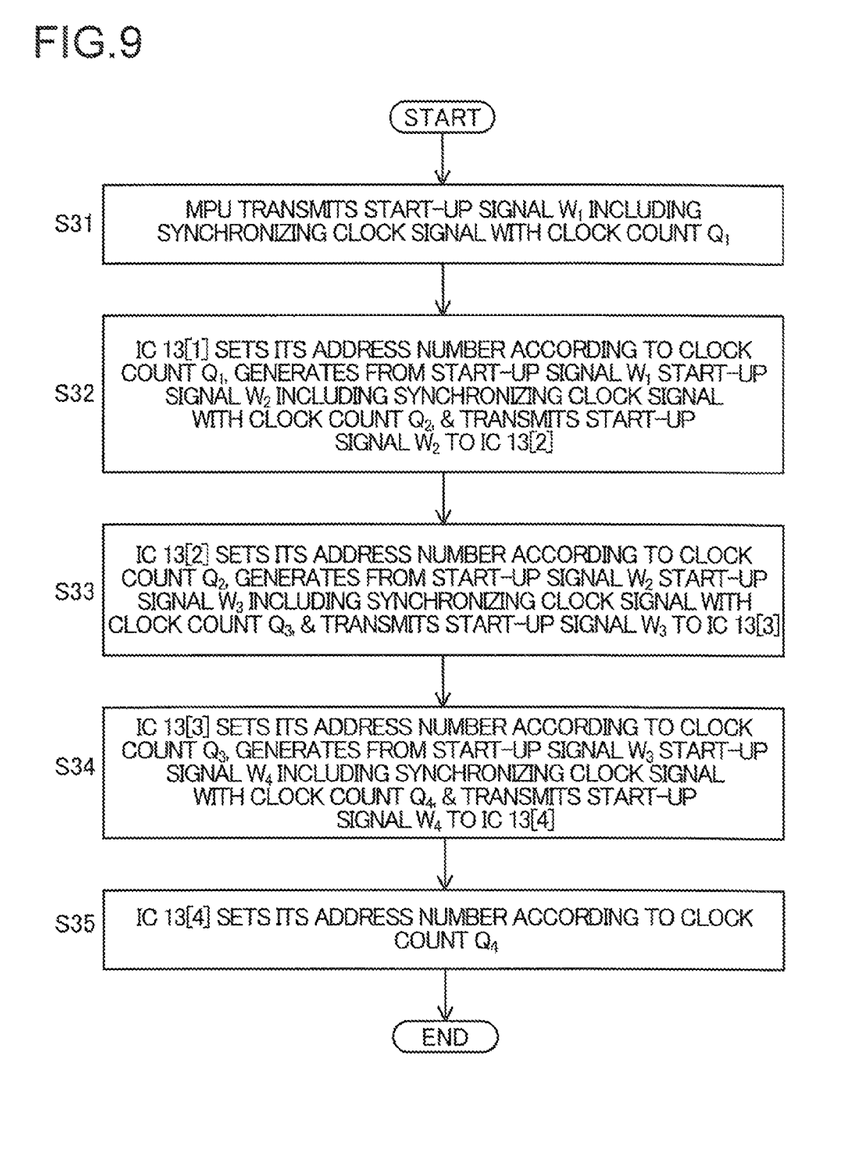
FIG. 9 is an operation flow chart of ID setting operation in a third example of the present invention.

A third example of the power system 1 will be described. The third example deals with a method for ID setting operation different from the one described in connection with the first example. The operation in the third example, and also in the later-described fourth example, can be adopted in the configuration described in connection with the second example. For concreteness' sake, also in the third example, it is assumed that n=4. FIG. 9 is an operation flow chart of ID setting operation in the third example. The ID setting operation includes operations at steps S31 through S35.

Figure 10:
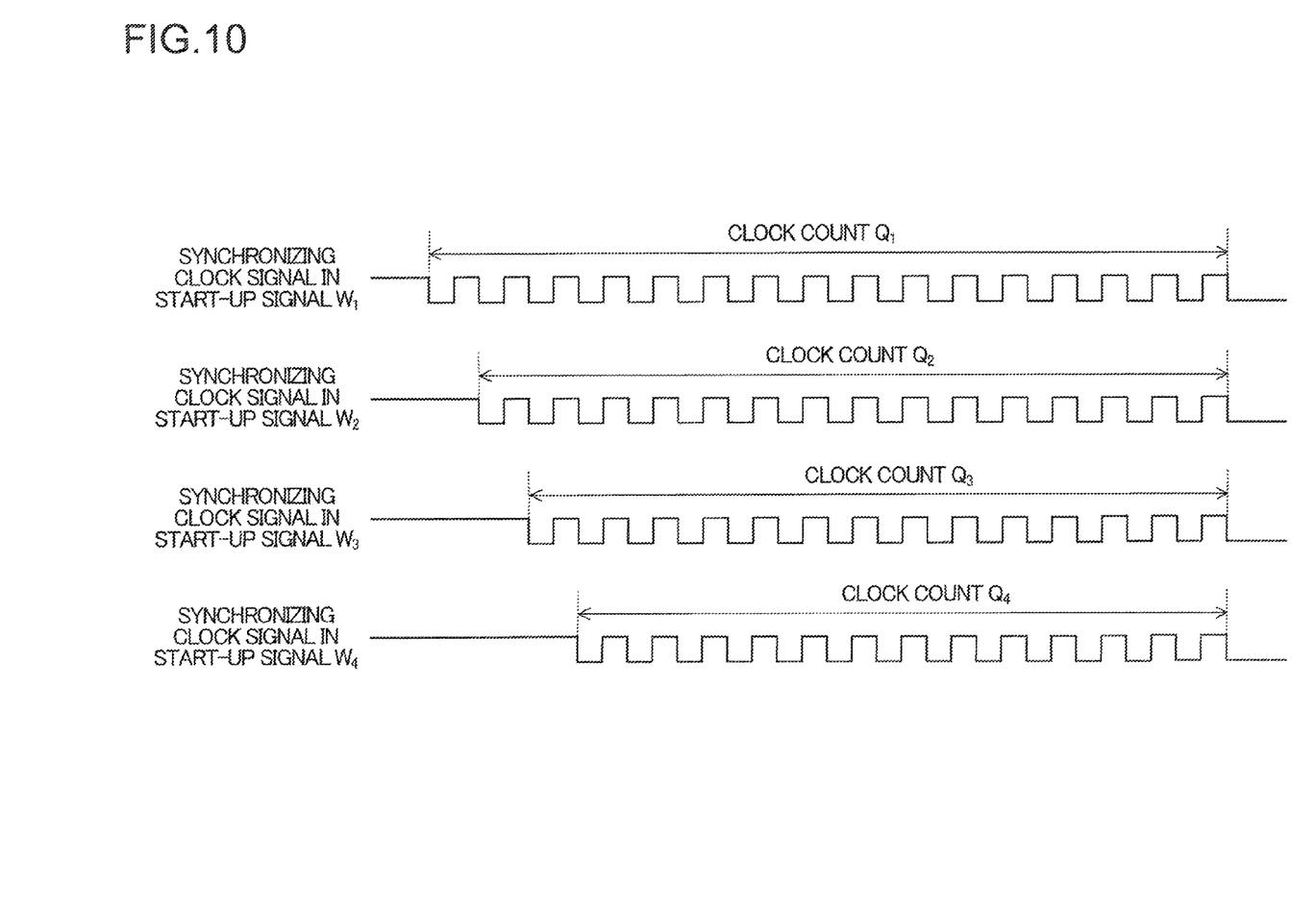
FIG. 10 is a diagram showing how a clock count changes in a synchronizing clock signal used in ID setting operation in the third example of the present invention.

First, at step S31, the MPU 14 outputs a start-up signal $W_1$ including a synchronizing clock signal SCLK with a predetermined clock count (number of clocks) $Q_1$ from the port 21 to the communication line CL[0:1] (see FIG. 10 also). As mentioned in connection with the second example, the synchronizing clock signal SCLK is output to the data line in the communication line CL, and is transferred along the data line.

On receiving the start-up signal $W_1$, at step S32, the IC 13[1] takes as its own address number the address number "1" corresponding to the clock count $Q_1$, and generates, based on the start-up signal $W_1$, a start-up signal $W_2$ including a synchronizing clock signal SCLK with a clock count $Q_2$; the IC 13[1] then outputs the start-up signal $W_2$ from the port 32 to the communication line CL[1:2] to transfer it to the IC 13[2].

On receiving the start-up signal $W_2$, at step S33, the IC 13[2] takes as its own address number the address number "2" corresponding to the clock count $Q_2$, and generates, based on the start-up signal $W_2$, a start-up signal $W_3$ including a synchronizing clock signal SCLK with a clock count $Q_3$; the IC 13[2] then outputs the start-up signal $W_3$ from the port 32 to the communication line CL[2:3] to transfer it to the IC 13[3].

On receiving the start-up signal $W_3$, at step S34, the IC 13[3] takes as its own address number the address number "3" corresponding to the clock count $Q_3$, and generates, based on the start-up signal $W_3$, a start-up signal $W_4$ including a synchronizing clock signal SCLK with a clock count $Q_4$; the IC 13[3] then outputs the start-up signal $W_4$ from the port 32 to the communication line CL[3:4] to transfer it to the IC 13[4].

On receiving the start-up signal $W_4$, at step S35, the IC 13[4] takes as its own address number the address number "4" corresponding to the clock count $Q_4$. Thereafter, like the IC 13[1] etc., the IC 13[4] can generate, based on the start-up signal $W_4$, a start-up signal $W_5$ including a synchronizing clock signal SCLK with a clock count $Q_5$ and output the start-up signal $W_5$ from the port 32. However, no IC 13 exists that receives the start-up signal $W_5$. Incidentally, generating a start-up signal $W_{i+1}$ based on a start-up signal $W_i$ corresponds to changing the clock count of a synchronizing clock signal SCLK in a start-up signal from $Q_i$ to $Q_{i+1}$.

As shown in FIG. 10, the clock counts $Q_1$ to $Q_4$ differ from one another, and thus the address numbers corresponding to the clock counts $Q_1$ to $Q_4$ differ from one another. The clock count $Q_5$ differs from any of the clock counts $Q_1$ to $Q_4$, and thus the address number corresponding to the clock count $Q_5$ differs from any of the address numbers corresponding to the clock counts $Q_1$ to $Q_4$. However, since no IC 13 exists that receives the start-up signal $W_5$, in the following description, the clock count $Q_5$ and the start-up signal $W_5$ will be ignored. Each IC 13 is previously notified that the clock counts $Q_1$, $Q_2$, $Q_3$, and $Q_4$ correspond respectively to the address numbers "1," "2," "3," and "4."

So long as the clock counts $Q_1$ to $Q_4$ differ from one another, the clock counts $Q_1$ to $Q_4$ can each be any specific number. For a given integer i, the clock count $Q_{i+1}$ can be a predetermined number greater than the clock count $Q_i$. However, in the following description, it is assumed that the clock count $Q_{i+1}$ is a predetermined number smaller than the clock count $Q_i$. Then, the IC 13[i] generates from a synchronizing clock signal SCLK with a clock count $Q_i$ a synchronizing clock signal SCLK with a clock count $Q_{i+1}$, and transfers the generated synchronizing clock signal SCLK from the port 32 via the communication line CL[i: i+1] to the IC 13[i+1]. The predetermined number can be 1, or 2 or more.

Each start-up signal either functions as a start-up command for instructing an IC 13 to start up, or includes a start-up command. Thus, on receiving a start-up signal $W_i$, the IC 13[i] executes predetermined start-up operation. The contents of the start-up operation are as described previously.

As with the first example, according to the third example, there is no need for terminals dedicated to address setting as are needed in the first conventional method. Moreover, according to the third example, through simple operation involving changing clock counts in synchronizing clock signals on passage through the voltage detection ICs 13, desired ID setting operation can be achieved, and therefore there is no need to additionally furnish the individual voltage detection ICs with a function for address setting as in the second conventional method. Moreover, the MPU 14 no longer needs to perform address setting for every voltage detection IC, and has only to transmit a start-up signal to the IC 13[1].

Fourth Example

A fourth example of the power system 1 will be described. The fourth example is one example of implementation of the technology of the third example, and accordingly, unless inconsistent, the description given above in connection with the third example applies equally to the fourth example.

Figure 11:
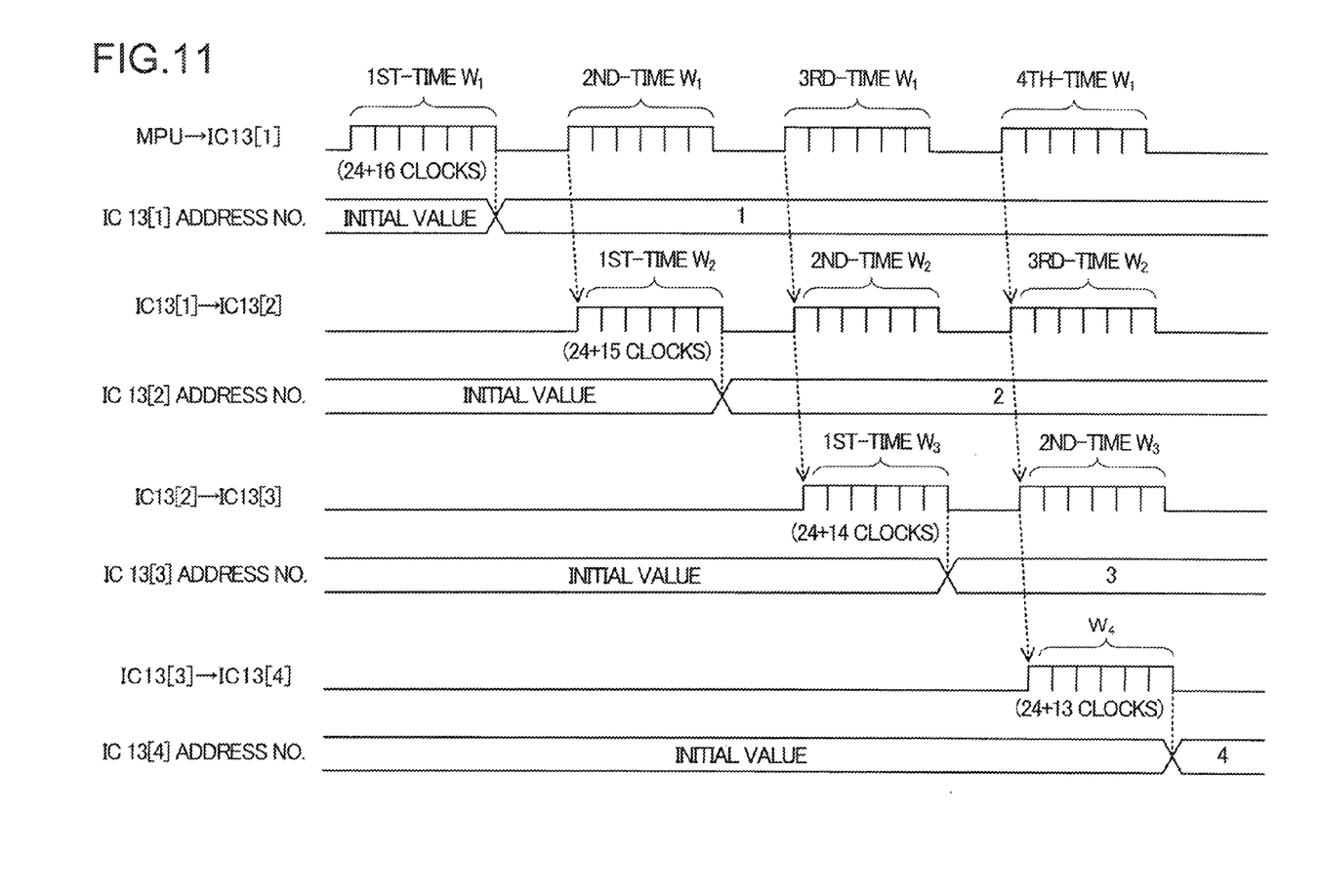
FIG. 11 is a diagram illustrating ID setting operation in a fourth example of the present invention.

To secure the time for the start-up operation in each IC 13, the ID setting operation can be performed through a flow as shown in FIG. 11. In the example shown in FIG. 11, start-up signals $W_1$ to $W_4$ each include a start-up command and dummy clocks for address setting (in other words, a dummy clock signal). A start-up command is a three-byte signal DATA included in each of the start-up signals $W_1$ to $W_4$, and thus a start-up command is transferred along with a 24-clock synchronizing clock signal SCLK.

The dummy clocks included in a start-up signal $W_i$ constitute a synchronizing clock signal SCLK worth (40−24−i+1) clocks that is appended to the above-mentioned 24-clock synchronizing clock signal SCLK. Accordingly, the start-up signal $W_1$ includes a 24-clock synchronizing clock signal SCLK for start-up command transfer and a 16-clock synchronizing clock signal SCLK as dummy clocks (that is, the synchronizing clock signal SCLK in the start-up signal $W_1$ is worth 40 clocks); the start-up signal $W_2$ includes a 24-clock synchronizing clock signal SCLK for start-up command transfer and a 15-clock synchronizing clock signal SCLK as dummy clocks (that is, the synchronizing clock signal SCLK in the start-up signal $W_2$ is worth 39 clocks); the start-up signal $W_3$ includes a 24-clock synchronizing clock signal SCLK for start-up command transfer and a 14-clock synchronizing clock signal SCLK as dummy clocks (that is, the synchronizing clock signal SCLK in the start-up signal $W_3$ is worth 38 clocks); and the start-up signal $W_4$ includes a 24-clock synchronizing clock signal SCLK for start-up command transfer and a 13-clock synchronizing clock signal SCLK as dummy clocks (that is, the synchronizing clock signal SCLK in the start-up signal $W_4$ is worth 37 clocks). Needless to say, during transfer of a start-up signal $W_i$, the signal CS is kept at low level. During transfer of dummy clocks, a signal DATA conveys no significant information.

In the ID setting operation, the MPU 14 outputs the start-up signal $W_1$, which is configured as described above to be worth 40 clocks, to the communication line CL[1:0] repeatedly at intervals. Since it is here assumed that n=4, the MPU 14 has to output the start-up signal $W_1$ four times. Before the start-up signal $W_1$ is output for the first time, the address numbers of the ICs 13[1] to 13[4] all have a predetermined initial value.

On receiving the first-time start-up signal $W_1$, the IC 13[1] takes as its own address number the address number "1" according to the clock count (that is, 16) of the dummy clocks in the start-up signal $W_1$. Since the clock count of the synchronizing clock signal SCLK for start-up command transfer in the start-up signal $W_1$ is fixed at 24, setting an address number according to the clock count of dummy clocks is equivalent to setting an address number according to the clock count $Q_1$ (that is, 40=24+16) of the start-up signal $W_1$ (the same applies equally to the later-described address number setting operation in the ICs 13[2] to 13[4]). In response to reception of the first-time start-up signal $W_1$, the IC 13[1] executes start-up operation including address number setting. No signal based on the first-time start-up signal $W_1$ is transferred from the IC 13[1] to the IC 13[2].

On completion of the start-up operation of the IC 13[1], the MPU 14 outputs the second-time start-up signal $W_1$ to the communication line CL[1:0]. When an IC 13[i] that has not completed the start-up operation receives a start-up signal $W_i$, the IC 13[i] executes the start-up operation; when the IC 13[i] receives a start-up signal $W_i$ once again after completion of the start-up operation, the IC 13[i] generates from the start-up signal $W_i$ a start-up signal $W_{i+1}$, and outputs the generated start-up signal $W_{i+1}$ to the communication line CL[i:i+1] to transfer it to the IC 13[i+1] (however, in a case where i=n=4, the start-up signal $W_{i+1}$ is not transferred to the IC 13[i+1]). Accordingly, on receiving the second-time start-up signal $W_1$, the IC 13[1] generates from the second-time start-up signal $W_1$ a start-up signal $W_2$, and outputs the generated start-up signal $W_2$ to the communication line CL[1:2] to transfer it to the IC 13[2]. The start-up signal $W_2$ based on the second-time start-up signal $W_1$ is the first-time start-up signal $W_2$. In response to reception of the first-time start-up signal $W_2$, the IC 13[2] executes the start-up operation, and during this start-up operation, the IC 13[2] takes as its own address number the address number "2" according to the clock count (that is, 15) of the dummy clocks in the start-up signal $W_2$. No signal based on the first-time start-up signal $W_2$ is transferred from the IC 13[2] to the IC 13[3].

On completion of the start-up operation of the IC 13[2], the MPU 14 outputs the third-time start-up signal $W_1$ to the communication line CL[1:0]. The IC 13[1] generates from the third-time start-up signal $W_1$ a second-time start-up signal $W_2$, and outputs the generated second-time start-up signal $W_2$ to the communication line CL[1:2] to transfer it to the IC 13[2]. The IC 13[2] generates from the second-time start-up signal $W_2$ a first-time start-up signal $W_3$, and outputs the first-time start-up signal $W_3$ to the communication line CL[2:3] to transfer it to the IC 13[3]. In response to the first-time start-up signal $W_3$, the IC 13[3] executes the start-up operation, and during this start-up operation, the IC 13[3] takes as its own address number the address number "3" according to the clock count (that is, 14) of the dummy clocks in the start-up signal $W_3$. No signal based on the first-time start-up signal $W_3$ is transferred from the IC 13[3] to the IC 13[4].

On completion of the start-up operation of the IC 13[3], the MPU 14 outputs the fourth-time start-up signal $W_1$ to the communication line CL[1:0]. The IC 13[1] generates from the fourth-time start-up signal $W_1$ a third-time start-up signal $W_2$, and outputs the generated third-time start-up signal $W_2$ to the communication line CL[1:2] to transfer it to the IC 13[2]. The IC 13[2] generates from the third-time start-up signal $W_2$ a second-time start-up signal $W_3$, and outputs the second-time start-up signal $W_3$ to the communication line CL[2:3] to transfer it to the IC 13[3]. The IC 13[3] generates from the second-time start-up signal $W_3$ a start-up signal $W_4$, and outputs the start-up signal $W_4$ to the communication line CL[3:4] to transfer it to the IC 13[4]. In response to reception of the start-up signal $W_4$, the IC 13[4] executes the start-up operation, and during this start-up operation, the IC 13[4] takes as its own address number the address number "4" according to the clock count (that is, 13) of the dummy clocks in the start-up signal $W_4$. On completion of the start-up operation of the IC 13[4], the system start-up operation at step S1 is completed, and an advance is made to step S2 (see FIG. 2).

As described in connection with the first example (see FIGS. 4 and 5), the IC 13[$i$] can transmit a start-up completion signal to the MPU 14 after completion of the start-up operation. By receiving the start-up completion signal from the IC 13[$i$], the MPU 14 can recognize that the start-up operation by the IC 13[$i$] has been completed. Instead, considering that the time required for the start-up operation by an IC 13 is roughly known previously, the MPU 14 can, without waiting for reception of start-up completion signals, output start-up signals $W_1$ four times, at predetermined time intervals, to the communication line CL[0:1] (in that case, there is no need for transmission of start-up completion signals from the ICs 13).

The IC 13[$i$] can adopt any method to generate a start-up signal $W_{i+1}$ from a start-up signal $W_i$. A start-up signal $W_{i+1}$ can be generated simply by subtracting one clock from the dummy clocks in a start-up signal $W_i$. As is well known, a signal to be transmitted is affected by various factors during transfer, such as attenuation via the communication line CL, distortion of the waveform, and an increase in jitter. An operation for restoring a received electrical signal with a view to maintaining its quality during transfer is known as re-timing. Re-timing can be adopted in the IC 13[$i$]. Specifically, the IC 13[$i$] can adopt well-known re-timing for restoring a start-up signal received from the high side (the restored signal is a start-up signal $W_{i+1}$), and during such re-timing, the voltage detection IC 13[$i$] can subtract one clock from dummy clocks through, for example, inversion of the signal level.

The specifications are assumed to be such that, at the maximum, sixteen ICs 13 can be connected to the MPU 14, and accordingly, in the example shown in FIG. 11, the clock count of the dummy clocks in the start-up signal $W_1$ is "16." Needless to say, the maximum number of voltage detection ICs 13 that can be connected to the MPU 14 can be other than 16, and accordingly, the clock count of the dummy clocks in the start-up signal $W_1$ can be other than "16." The difference between the clock count of the dummy clocks in the start-up signal $W_i$ and the clock count of the dummy clocks in the start-up signal $W_{i+1}$ can be two or more.

Fifth Example

A fifth example of the power system 1 will be described. The power system 1 includes a voltage detection device. The voltage detection device in the power system 1 includes an MPU 14 as a controller, ICs 13[1] to 13[$n$] as a plurality of voltage detectors, a communication line CL, and an isolator 15. The power system 1 includes a semiconductor device that constitutes the voltage detection device, or a semiconductor device that includes the voltage detection device. In the semiconductor device, the ICs 13[1] to 13[$n$] and the MPU 14 can each be built by use of a semiconductor integrated circuit.

The power system 1, the above-mentioned voltage detection device, or the above-mentioned semiconductor device can be incorporated in any device or system. The device or system can be of any kind so long as it is so configured that a controller and a plurality of ICs are connected in a daisy-chain configuration and that the plurality of ICs need to be assigned unique IDs.

Figure 12:
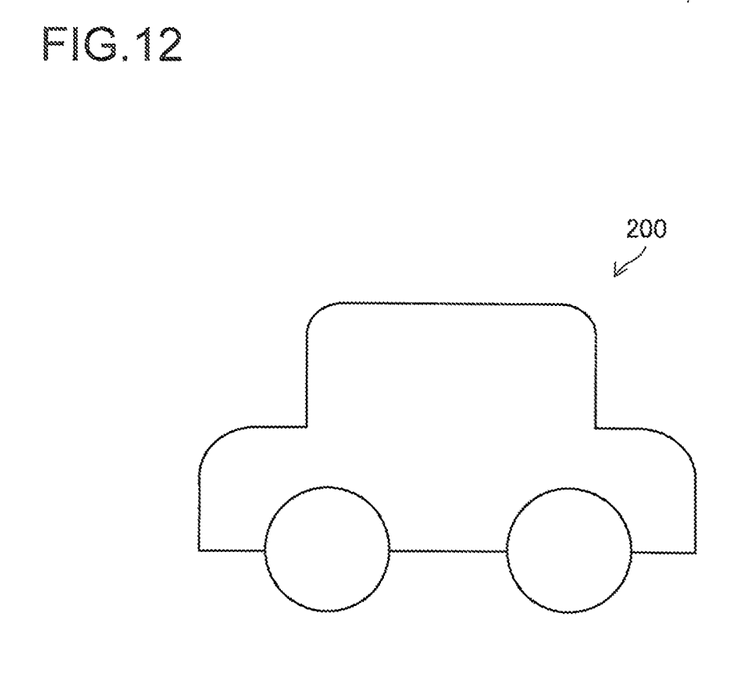
FIG. 12 is an exterior view of an electric vehicle in a fifth example of the present invention.

For example, the power system 1 can be incorporated in an electric vehicle 200 as shown in FIG. 12. The electric vehicle 200 is a vehicle that runs by use of the discharge electric power of a battery pack 11 provided in the power system 1. In the power block 12 of the electric vehicle 200, a motor (not shown) for driving wheels of the electric vehicle 200 functions as a load. The regenerative energy of the motor can be used as a charge power source for the power block 12. The electric vehicle 200 can be an electric vehicle that runs by using, as a driving power source, the battery pack 11 alone, or a hybrid electric vehicle that runs by using, as a driving power source, the battery pack 11 and an energy source (for example, fossil fuel) other than the battery pack 11. The battery pack 11 mounted on the electric vehicle 200 can be charged by use of commercial AC electric power supplied via an AC outlet. An electric vehicle 200 as a hybrid electric vehicle of this type is called a PHEV (plug-in hybrid electric vehicle). In FIG. 12, an automobile is shown as an example of the electric vehicle 200, but the electric vehicle 200 can instead be a two-wheeled motor vehicle or the like.

The electric vehicle 200 is a kind of mobile body that moves by use of the discharge electric power of the battery pack 11 provided in the power system 1. Ships, walking robots, and the like, though not classified as electric vehicles, belong to the category of mobile bodies.

In addition to what has been mentioned above, the power system 1, the above-mentioned voltage detection device, or the above-mentioned semiconductor device can be incorporated in, for example, electric power storage systems, server devices, data storage systems, and uninterruptible power sources (for example, uninterruptible power sources for RAID (redundant arrays of inexpensive disks) systems).

Embodiments of the present invention allow for many variations and modifications within the spirit and scope of the technical concepts recited in the appended claims. The embodiments described above merely present examples of how the present invention can be implemented, and the senses of the terms used to describe the present invention and its features are not limited to those in which the terms are used in the description of the embodiments. Any specific values mentioned in the above description are merely examples, and, needless to say, can be changed to many different values.

What is claimed is:

1. A voltage detection device, comprising:
first to nth voltage detectors (where n is an integer equal to or greater than 2) which are connected to a battery pack composed of a plurality of unit batteries connected together, the battery pack being divided into n blocks, the first to nth voltage detectors detecting terminal voltages of the individual unit batteries on a block-by-block basis;
a controller which receives voltage detection result signals indicating results of detection of the terminal voltages from the first to nth voltage detectors respectively after ID setting operation whereby the first to nth voltage detectors are assigned mutually different unique IDs; and
a communication line which connects together the controller, the first voltage detector, the second voltage detector, . . . and the nth voltage detector in series in this order,
wherein
the communication line includes a synchronizing clock line for transfer of a synchronizing clock signal for achieving synchronization between the controller and the voltage detectors, and
in the ID setting operation, the controller outputs a synchronizing clock signal with a predetermined clock count to the synchronizing clock line between the controller and the first voltage detector, the ith voltage detector outputs a synchronizing clock signal based on a received synchronizing clock signal to the synchronizing clock line between the ith voltage detector and (i+1)th voltage detector such that a clock count in a synchronizing clock signal received by each voltage detector differs among the first to n-th voltage detectors (where i is a natural number equal to or less than (n−1)), and each voltage detector takes as its own unique ID a unique ID according to the clock count in the received synchronizing clock signal.

2. The voltage detection device according to claim 1, wherein, in the ID setting operation, the ith voltage detector, on receiving a synchronizing clock signal from the controller or from the (i−1)th voltage detector, generates a synchronizing clock signal with a clock count a predetermined number smaller than a clock count in the received synchronizing clock signal, and transfers the generated synchronizing clock signal via the synchronizing clock line between the ith voltage detector and the (i+1)th voltage detector to the (i+1)th voltage detector.

3. The voltage detection device according to claim 1, wherein
in the ID setting operation, the controller outputs the synchronizing clock signal with the predetermined clock count to the synchronizing clock line between the controller and the first voltage detector repeatedly at predetermined time intervals, and
each voltage detector, on receiving a synchronizing clock signal before its own unique ID is set, takes as its own unique ID a unique ID according to the clock count in the received synchronizing clock signal, and the ith voltage detector, on further receiving a synchronizing clock signal after its own unique ID has been set, outputs a synchronizing clock signal based on the further received synchronizing clock signal to the synchronizing clock line between the ith voltage detector and the (i+1)th voltage detector.

4. The voltage detection device according to claim 1, wherein, after the ID setting operation, the controller, while distinguishing the first to n-th voltage detectors from one another by use of the set unique IDs, communicates with the individual voltage detectors via the communication line.

5. A semiconductor device which constitutes the voltage detection device according to claim 1,
wherein the voltage detectors and the controller in the voltage detection device are built with integrated circuits.

6. An electric power system, comprising:
the voltage detection device according to claim 1;
a battery pack which is connected to the voltage detection device; and
a power block which supplies charge electric power to, or receives discharge electric power from, the battery pack.

7. A mobile body, comprising the electric power system according to claim 6,
wherein the mobile body moves by use of discharge electric power of the battery pack provided in the electric power system.

* * * * *